(12) United States Patent  (10) Patent No.: US 8,188,653 B2
Matsueda  (45) Date of Patent: May 29, 2012

(54) ELECTRO-OPTICAL DEVICE AND AN ELECTRONIC APPARATUS (75) Inventor: Yojiro Matsueda, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/171,018

(22) Filed: Jun. 28, 2011

(65) Prior Publication Data

US 2011/0256650 A1  Oct. 20, 2011

Related U.S. Application Data (60) Division of application No. 11/806,402, filed on May 31, 2007, now Pat. No. 7,977,863, which is a continuation of application No. 11/158,095, filed on Jun. 22, 2005, now Pat. No. 7,304,437, which is a division of application No. 10/308,012, filed on Dec. 3, 2002, now Pat. No. 6,949,883.

(30) Foreign Application Priority Data

Dec. 6, 2001  (JP) ................................. 2001-372761
Dec. 3, 2002  (JP) ................................. 2002-351609

(51) Int. Cl.
H01J 1/62 (2006.01)
H01J 63/04 (2006.01)
G09G 3/10 (2006.01)

(52) U.S. Cl. ......................................... 313/504; 445/24

(58) Field of Classification Search .................. 313/500, 313/504, 505, 506, 509; 315/169.1, 169.2, 315/169.3, 169.4; 257/40, 79, 88, 202; 345/55, 345/76; 445/24, 25; 349/42, 143, 151

See application file for complete search history.

(56) References Cited

U.S. PATENT DOCUMENTS

| 5,767,827 | A | 6/1998 | Kobayashi et al. |
| 5,805,947 | A | 9/1998 | Miyamoto et al. |
| 6,145,981 | A | 11/2000 | Akahira et al. |
| 6,157,429 | A | 12/2000 | Miyawaki et al. |
| 6,194,837 | B1 | 2/2001 | Ozawa |
| 6,204,895 | B1 | 3/2001 | Nakamura et al. |
| 6,225,750 | B1 | 5/2001 | Kimura |
| 6,290,352 | B1 | 9/2001 | Marumoto et al. |
| 6,304,670 | B1 | 10/2001 | Berestov |
| 6,312,771 | B1 | 11/2001 | Kashiwazaki et al. |
| 6,341,862 | B1 | 1/2002 | Miyazaki et al. |
| 6,342,321 | B1 | 1/2002 | Sakamoto et al. |

(Continued)

FOREIGN PATENT DOCUMENTS

CN 1282064 A 1/2001

(Continued)

Primary Examiner — Dung Nguyen
Assistant Examiner — Tai Duong
(74) Attorney, Agent, or Firm — Oliff & Berridge, PLC (57) ABSTRACT An electro-optical device that drives each of plural pixels individually arranged in two dimensions so as to display information, is provided with a group of pixels displaying the information within an effective display region among the plural pixels arranged in two dimensions. A group of plural pseudo-pixels that do not contribute to the display of the information are located adjacent to a group of pixels within the effective display region. A bank layer separates a pixel in the group of the plural pseudo-pixels from a pixel in the group of pixels in the effective display region, and shields light leaked from a space between pixels located adjacently each other within the effective display region.

3 Claims, 10 Drawing Sheets

Cross sectional view along X-Y direction

U.S. PATENT DOCUMENTS

| | | |
|---|---|---|
| 6,364,450 B1 | 4/2002 | Yamaguchi et al. |
| 6,386,700 B1 | 5/2002 | Akahira |
| 6,394,578 B1 | 5/2002 | Akahira et al. |
| 6,433,841 B1 | 8/2002 | Murade et al. |
| 6,454,416 B2 | 9/2002 | Aoto et al. |
| 6,618,029 B1 | 9/2003 | Ozawa |
| 6,620,528 B1 | 9/2003 | Yamazaki et al. |
| 6,784,459 B2 | 8/2004 | Seki et al. |
| 6,795,049 B2 | 9/2004 | Toyoshima et al. |
| 6,882,102 B2 | 4/2005 | Yamazaki |
| 6,887,631 B2 | 5/2005 | Kiguchi et al. |
| 2002/0000576 A1 | 1/2002 | Inukai et al. |
| 2002/0093469 A1 | 7/2002 | Suzuki et al. |
| 2002/0186192 A1 | 12/2002 | Maruoka et al. |
| 2003/0122495 A1 * | 7/2003 | Nakanishi .................. 315/169.3 |

FOREIGN PATENT DOCUMENTS

| | | |
|---|---|---|
| CN | 1323995 A | 11/2001 |
| EP | 0 708 355 B1 | 4/1996 |
| EP | 0 984 303 A1 | 3/2000 |
| EP | 1 209 744 A2 | 5/2002 |
| JP | A-04-225317 | 8/1992 |
| JP | A-05-05879 | 1/1993 |
| JP | A-06-258650 | 9/1994 |
| JP | A-07-333654 | 12/1995 |
| JP | A-08-15722 | 1/1996 |
| JP | A-08-122768 | 5/1996 |
| JP | A-09-101410 | 4/1997 |
| JP | A-09-160095 | 6/1997 |
| JP | A-10-170935 | 6/1998 |
| JP | A-10-177181 | 6/1998 |
| JP | A-11-024604 | 1/1999 |
| JP | A-11-052427 | 2/1999 |
| JP | A-11-052447 | 2/1999 |
| JP | A-11-142829 | 5/1999 |
| JP | A-2000-284727 | 10/2000 |
| JP | A-2000-357584 | 12/2000 |
| JP | A-2001-188117 | 7/2001 |
| JP | A-2001-319789 | 11/2001 |
| KR | 1999-0030335 A | 4/1999 |
| KR | 2000-0068316 A | 11/2000 |
| WO | WO 98/36407 | 8/1998 |

* cited by examiner

FIG.1

Enlarged view of A portion

FIG.2

Cross sectional view along X-Y direction

FIG.3

Enlarged view of A portion

FIG.4

Cross sectional view along X-Y direction

ELECTRO-OPTICAL DEVICE AND AN ELECTRONIC APPARATUS

This is a Divisional of application Ser. No. 11/806,402 filed May 31, 2007, which is a Continuation of application Ser. No. 11/158,095 filed Jun. 22, 2005, which is a Division of application Ser. No. 10/308,012 filed Dec. 3, 2002 (issued as U.S. Pat. No. 6,949,883). The disclosures of the prior applications are hereby incorporated by reference herein in their entirety.

BACKGROUND OF THE INVENTION

1. Field of Invention

The present invention relates to electro optical devices, such as a liquid crystal display device or an organic EL display device. More specifically, the invention relates to an electro optical device provided with a structure to enhance product precision of the device in a production process of the electro optical device.

2. Description of Related Art

The related art includes an active matrix drive system as a drive system for an electro optical device that is provided with a liquid crystal element, an organic EL element, an electrophoresis element, or an electron-releasing element.

In an electro optical device of active matrix drive system, plural pixels are arranged in a matrix within a display panel. Each of plural pixels is provided with a pixel circuit that includes an electro optical element and a drive transistor that supplies drive power to an electro optical element. In addition, each of plural pixel circuits is arranged at the intersection between a data line and a scanning line, as disclosed in WO98/36407.

SUMMARY OF THE INVENTION

However, when various kinds of electronic apparatus, such as a cellular phone and a personal computer, are facilitated by installing an electro optical device on their substrates, it sometime occurs that displaying on the display region becomes unclear depending on a color of a peripheral display region in the electronic apparatus.

In addition, when a functional layer, providing an electro optical function on an effective display region of an electro optical device, is formed, uniformity of such layer deteriorates depending on a localized environment or an atmosphere, if such functional layer is formed by a liquid phase process, such as an inkjet method (a method of discharging a droplet) or a gas phase process, such as evaporation method. As a result, there is a problem of unevenness on displaying.

Therefore, the present invention provides an electro optical device overcoming the above-mentioned and/or other problems.

In order to address or achieve the above, a first exemplary electro optical device of the present invention drives each of plural pixels individually arranged in two dimensions, so as to display information. The electro optical device includes a group of pixels displaying information within an effective display region among the plural pixels arranged in two dimensions; a group of plural pseudo-pixels that do not contribute to the display of information, being located adjacent to a group of pixels within the effective display region; and a bank layer separating a pixel in the group of the plural pseudo-pixels from a pixel in the group of the pixels in the effective display region, and shielding light leaked from a space between pixels located adjacent each other within the effective display region.

A second exemplary electro optical device of the present invention includes a plurality of pixels and includes: a group of pixels within a effective display region, of which brightness is set in response to a data signal and a group of pseudo-pixels, of which brightness does not depend on the data signal.

According to the above-mentioned structure of the electro optical device, when a layer is formed by using an inkjet method, a material is ejected to form the layer in the display region after the amount of ejected ink is stabilized in the pseudo-pixels region so that it is possible to form the group of pixels in the effective display region with the uniform and constant thickness.

Further, when the layer is formed by an evaporation method, an atmosphere or an existence density of a vaporized material is different locally so that the thickness of the layer including the pixel in the effective display region is not constant. On the other hand, if the group of pseudo-pixels or the group of dummy pixel area is installed, a functional layer including the pixel in the effective display region can be formed by utilizing a portion where an atmosphere or an existence density of a vaporized material is uniformed.

In addition, the group of pseudo-pixels or the group of dummy pixels is utilized for various kinds of applications. For example, various kinds of drive circuits, such as a scanning line drive circuit or a data line drive circuit, may be installed in the dummy pixel region. Under such a structure, a limited space can be effectively utilized.

It is preferable that the group of plural pseudo-pixels is located at least on one side of the effective display region.

It is preferable that the group of plural pseudo-pixels is located with sandwiching the group of pixels in the effective display region.

It is further preferable that the group of plural pseudo-pixels is located surrounding the group of pixels in the effective display region.

According to the above-mentioned structure, thickness uniformity of a functional layer including the pixel in the effective display region can be further enhanced. In addition, when an electronic apparatus provided with the above mentioned electro optical device on its substrate is manufactured, a group of pseudo-pixels or a group of dummy pixel area that does not depend on an image displayed in an effective display region of an electro optical device can be installed, and a boundary between the above substrate and displayed image becomes clear since a region to show a selected color appropriately is installed.

According to the above-mentioned electro optical device, it is preferable that the bank layer makes the shape of the group of pixels in the effective display region to be almost the same as the shape of the group of plural pseudo-pixels. According to such a structure, conditions (a thickness of an layer, for example) of pixels in the above-mentioned effective display region can be the same condition of pixels in the group of pseudo-pixels or the group of dummy pixels area so that a pixel in the group of pseudo-pixels or the group of dummy pixel area can be examined instead of examining pixels in the above-mentioned effective display region.

In the above-mentioned electro optical device, at least one of structural elements including each of the pixels of the effective display pixels group is provided with a functional layer that is formed by an inkjet method.

The structural element formed by the inkjet method can be an organic EL layer, for example. Also, for example, a carrier injection layer and a carrier transportation layer, such as a positive hole injection layer, a positive hole transportation layer, an electronic injection layer or an electronic transportation layer, may be formed by an inkjet method.

Further, the organic EL layer can be made, for example, of a high polymer including a fluorene derivative or a phenylenevinylen-series high polymer material.

In the above-mentioned electro-optical device, it is preferable that a hydrophilic control layer having affinity toward a liquid material used in the inkjet method is contacted with the functional layer.

Further, when the above-mentioned electro-optical device is provided with a bank layer separating each of pixels, it is preferable that the hydrophilic control layer is formed under the bank layer. If affinity of the bank toward a liquid material is lowered than that of a hydrophilic control layer, electric contamination between pixels is controlled and electric separation between pixels is achieved.

As the material of the bank layer and the hydrophilic control layer, polyimide of which surface is coated with fluorine and oxidized silicon layer that is hydrophilic-processed with plasma treatment can be used, for example.

In the electro optical device, the thickness of a functional layer including pixels in the group of pseudo-pixels or an area of the dummy pixels may be examined, and as the result of such examination, it may be determined whether a pixel located in the effective display region is acceptable or not.

In the electro optical device, the examination may be implemented by irradiating examination light onto the pseudo-pixel and detecting optical luminescence thereby. Such examination is simple and easy, and many electro optical devices can be examined within short time.

In the electro optical device, it is preferable that a circuit arrangement region be provided where a circuit is arranged at the lower part of the region of the group of the pseudo-pixels. According to this structure, a limited space can be effectively utilized.

As a circuit installed in the above-mentioned region for a circuit arrangement, a scanning line drive circuit, a data line drive circuit, a data handling circuit, an operational circuit can be used, for example.

The electro optical device can be used as a display panel of an electronic device, such as a computer device, a mobile type telephone device, a digital camera, an electronic book device and a mobile type information-processing device, for example.

In accordance with another embodiment, a method of manufacturing an electro-optical device is described, wherein the electro-optical device includes a data drive circuit and a substrate, the substrate having an effective display region and a pseudo-pixel region being positioned outside of the display region, the effective display region including a plurality of display pixels, the pseudo-pixel region not contributing a display. The method may comprise forming organic EL layers, for example by an inkjet method, on the effective display region and the pseudo-pixel region, wherein the organic EL layers formed on the pseudo-pixel region are disposed above a data line drive circuit or above a scanning line circuit.

DETAILED DESCRIPTION OF PREFERRED EMBODIMENTS

An exemplary embodiment of the present invention is described referring to drawings hereafter.

Figure 1:
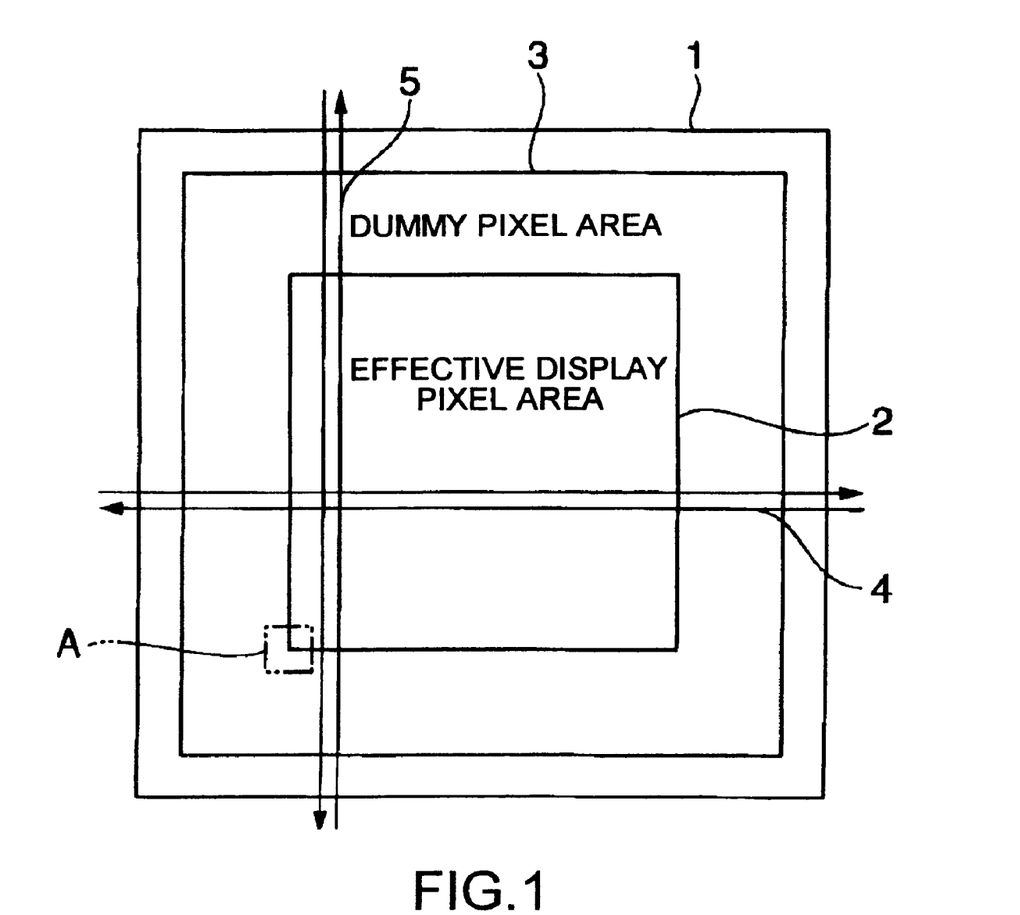
FIG. 1 is a schematic explaining the present invention.

FIG. 1 is a schematic showing the structure of a first exemplary embodiment of the present invention. According to the present invention, a pseudo-pixel region 3 where pseudo-pixels 30 that do not contribute to an image display, is arranged on the periphery of an effective display pixel region 2 where pixels are arranged to display an actual image in an display device 1. In the effective display pixel region 2, plural pixels 20 are arranged in two dimensions to change optical parameters such as light intensity and the transmittance ratio in response to electrical signals for image information. For example, each of pixels 20 includes an organic EL light emission element, for example. Each layer of this organic EL light emission element is formed by applying a material via an inkjet method.

In the first exemplary embodiment, pseudo-pixels 30 are arranged in two dimensions on both sides of right and left area and upper and lower area of the effective display region 2 with a shape of a pixel and a spacing between pixels, which are the same of the effective display pixel 20. An inkjet head (not shown in FIG. 1) is scanned in the right and left direction 4 or the top and bottom direction 5 so as to eject a material to form a layer. At this time, the inkjet head starts ejecting within this pseudo-pixel region 3 and then, forming a layer in an effective display pixel region 2 in a stable ejecting state. Namely, vacant ejection, which does not contribute to form an affective pixel, is completed within the pseudo-pixel region 3 at the beginning of ejecting ink (a material to form a layer) so as to stabilize the amount of ejected ink, and further vacant ink ejection is completed within the pseudo-pixel region 3 at the end of ejecting ink so as to prevent or reduce unevenness just before stopping the ejection. In the pseudo-pixel region 3 of the present exemplary embodiment, it is not necessary to supply a drive signal to pixel electrodes since they are not used for image display. In addition, in a later example, a drive circuit is not connected to a pixel with wiring. However, the shape of the pseudo-pixel is formed as the same shape of the effective pixel and a spacing and arrangement between the pseudo-pixels are the same spacing and arrangement between the effective pixels, since the amount of ejection should be stabilized as the same amount of ejection in the region of the effective display pixels and timing of ejection should be synchronized.

Figure 2:
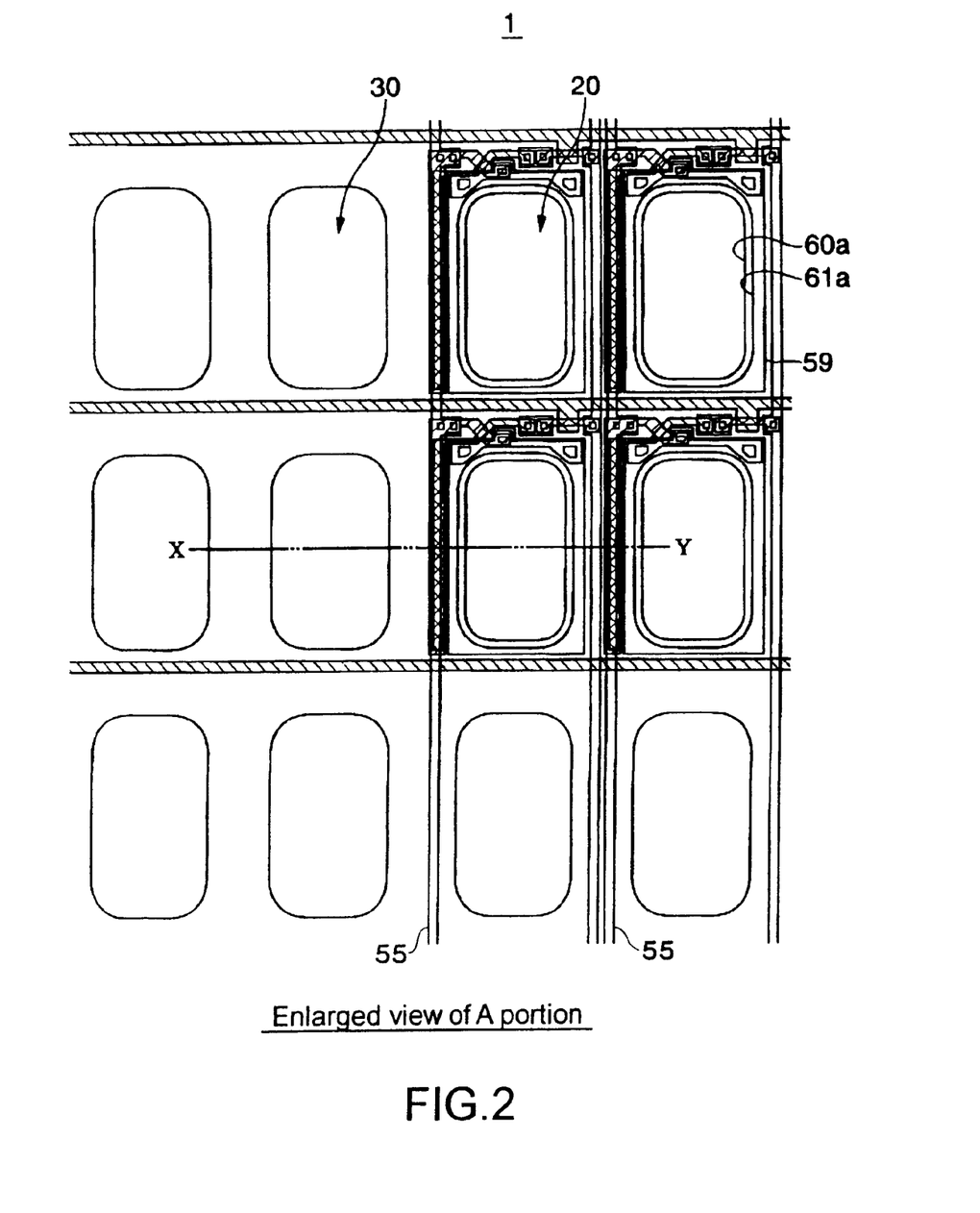
FIG. 2 is an enlarged view of portion A shown in FIG. 1.

FIG. 2 is an enlarged schematic showing a portion A (shown in FIG. 1) in a border between the effective display pixel region 2 and the pseudo-pixel region 3 of the display device 1.

The shape of the pseudo-pixel 30 in the pseudo-pixel region 3 and the effective pixel 20 in the effective display pixel region 2 is a rectangle or a substantial rectangle of which the four corners are round-shaped. As described above, the effective pixel 20 is connected to a transistor (TFT) and wiring to drive it. But, the pseudo-pixel 30 is not connected to them.

Figure 3:
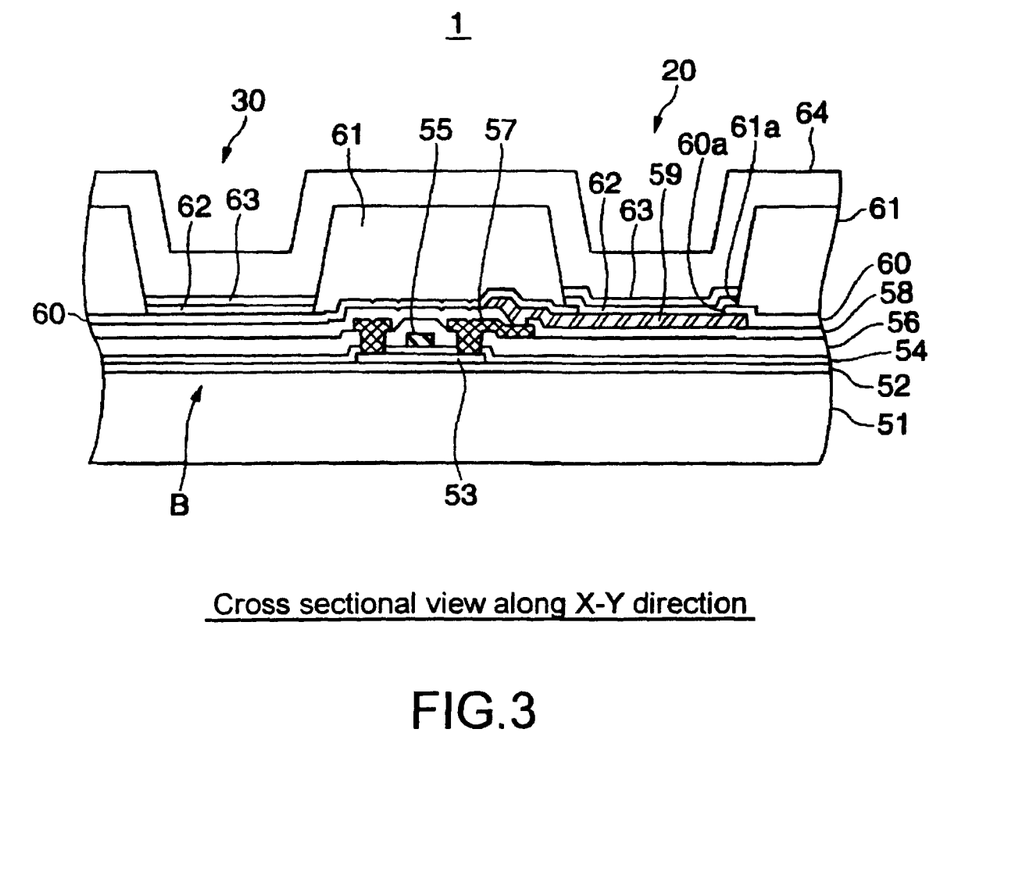
FIG. 3 is a sectional view of a constitutional example of the pixel 20 in an effective display region and pseudo-pixel 30.

FIG. 3 is a schematic cross-sectional view of the effective pixel 20 and the pseudo-pixel 30 taken along the X-Y direction shown in FIG. 2. As shown in FIG. 3, an under-protective layer 52 made of oxidized silicon (SiO2) or nitride silicon (SiNx) is formed on a transparent substrate 51, such as a glass or resin, in order to reduce or prevent an invasion of an alkali ion from the substrate 51. A semiconductor layer 53 is formed by accumulating silicon (Si) via a CVD method on this protective layer 52. This semiconductor layer 53 is annealed with a laser so as to form a polycrystalline layer by crystallization. Then, this semiconductor layer 53 is patterned so as to form a TFT region.

Next, a gate insulation layer 54 is formed on the semiconductor layer 53 and the under-protective layer 52 by accumulating oxide silicon, of which material is TEOS and oxygen, via a CVD method. Further, a metal, such as aluminum, is accumulated as a gate metal and patterned to form a gate electrode and a wiring 55. Oxide silicon is accumulated on this layer via a CVD method so as to be an interlayer insulation layer 56. A contact hole is opened in the interlayer insulation layer 56 corresponding to a source and drain region of the TFT region and a metal, such as aluminum, is accumulated within it and patterned to form source and drain electrodes and a wiring layer 57. Next, an interlayer insulation layer 58 is formed by accumulating oxidized silicon via a CVD method. A contact hole is opened in the interlayer insulation layer 58 so as to accumulate a transparent ITO (Indium Tin Oxide) layer 59. The wiring layer 57 is connected to the ITO layer 59. The ITO layer 59 is patterned so as to form a pixel electrode layer (an anode) 59. On this layer, a hydrophilic control layer 60 is formed by accumulating oxidized silicon via a CVD method in order to enhance adhesiveness of an ink (a material for a layer) ejected by an inkjet method to the substrate. This hydrophilic control layer 60 is patterned to open the region of the effective pixels and expose the transparent electrode ITO layer 59.

Next, oxide silicon is accumulated by a CVD method and patterned so as to open the region of the effective pixel 20 and the pseudo-pixel 30 and form a bank 61 to avoid light leak and color mixture between pixels.

An organic EL light emission element is formed in the trench opened at the bank 61 by an inkjet method. Namely, the inkjet head (not shown in FIG. 3) is moved relatively to scan each of openings of the bank 61 and eject a material to form a layer from a nozzle at the position opposite to such opening. A predetermined amount of a material for a layer is ejected to each of openings of the bank 61 within the region 2 of the effective pixels 20 by starting ejection from the region of the pseudo pixels 30. In addition, a material for a layer is ejected outside of the region of the effective pixels 20 so that it is possible to supply a predetermined mount of a material for a layer to the final one of effective pixels 20.

At first, a positive hole transportation layer 62 is formed on the ITO layer 59 exposed at the bottom of the trench in the bank 61 by an inkjet method. An end portion 60a of the opening of the hydrophilic control layer 60 is exposed at the bottom of the trench from the end portion 61a of the opening of the bank 61 so that a liquid material to form a layer ejected from the inkjet head, adapts the end portion 60a of the opening of the hydrophilic control layer 60 and easily spreads to the bottom portion of the rectangular opening with uniformity. An organic EL layer 63 is formed by an inkjet method on the positive hole transportation layer 62 formed on the ITO layer 59. An electronic transportation layer (not shown in FIG. 3) may further be formed on the organic EL layer 63. Furthermore, a cathode layer 64 is formed as the common electrode on the organic EL layer 63 so as to obtain the display device 1 where the organic EL emission light element is a unit pixel. Here, a conventional, related art or later developed drive circuit can be used.

According to the first exemplary embodiment, the conductive ITO layer 59 is not formed on the side of the pseudo-pixel 30. In this case, it is advantageous in that yield is enhanced since the device (the pixel) has an insulation against high voltage.

Figure 12:
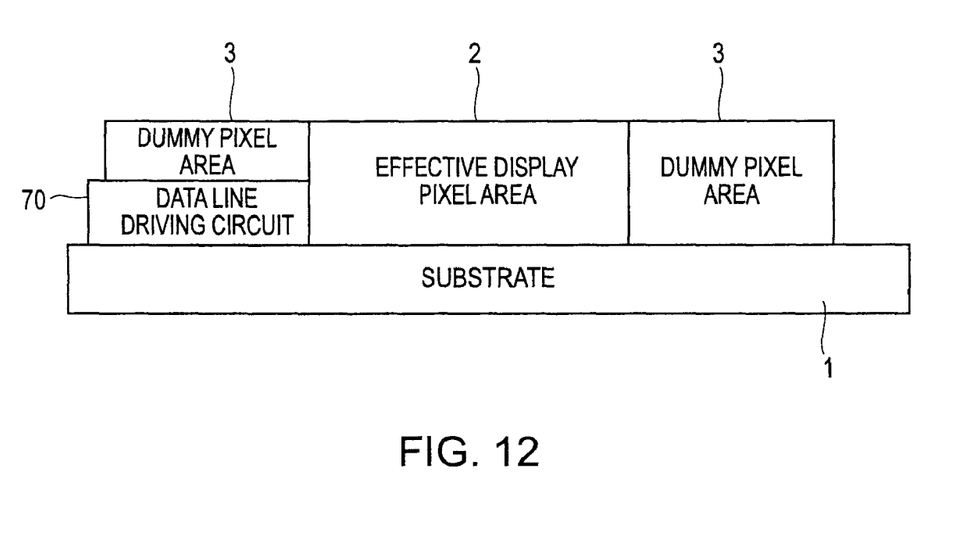
FIG. 12 shows a horizontal cross-sectional view of either of FIG. 6 or 7.

In addition, the region of the pseudo-pixel 30 is not used as actual display pixels so that it is possible to install a part of a pixel circuit to drive the effective pixel 20, a part of a scanning circuit and a data line drive circuit between the dummy pixel area and the substrate 51. For example, FIG. 12 shows a horizontal cross-section of either of FIG. 6 or 7. As seen in FIG. 12, the data line/scanning line driving circuit 70 can be positioned between the substrate 1 and the dummy pixel area 3. In this manner, the data line/scanning line driving circuit 70 can at least partially overlap the group of dummy pixels.

Figure 4:
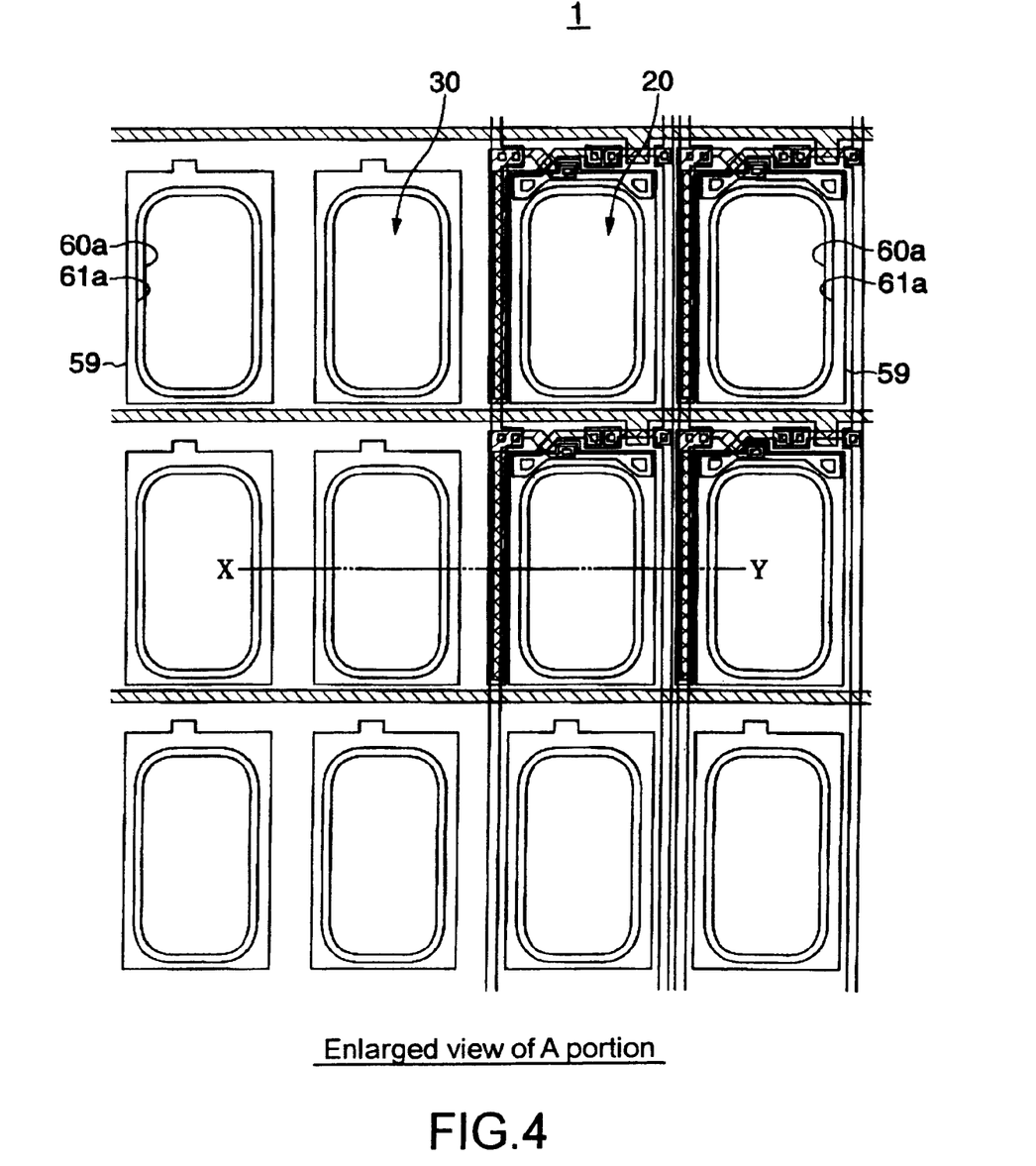
FIG. 4 is a schematic of another constitution of the pseudo-pixel 30.

FIG. 4 shows a second exemplary embodiment. The same reference numbers shown in FIG. 2 are referred to in FIG. 4 and explanation of them is omitted.

In this example, the ITO layer 59 and the hydrophilic control layer 60 are also formed in the region 3 of the pseudo-pixel 30. Hence, a layer, which is the same of each of layers of the organic EL element, is formed in the pseudo-pixel 30 as the same process of forming each of layers of the organic EL element in the effective pixel 20. However, wiring to the pseudo-pixel is intercepted and it is not used as displaying of image information. Further, it is possible to examine the uniformity of the layer by irradiating examination light onto the illumination layer of the pseudo-pixel 30 and detecting reactive illumination light.

Further, it is possible to utilize pseudo-pixels for automation of quality evaluation of the display device by installing another wiring to examine a layer with a part of pseudo-pixels 30.

Figure 5:
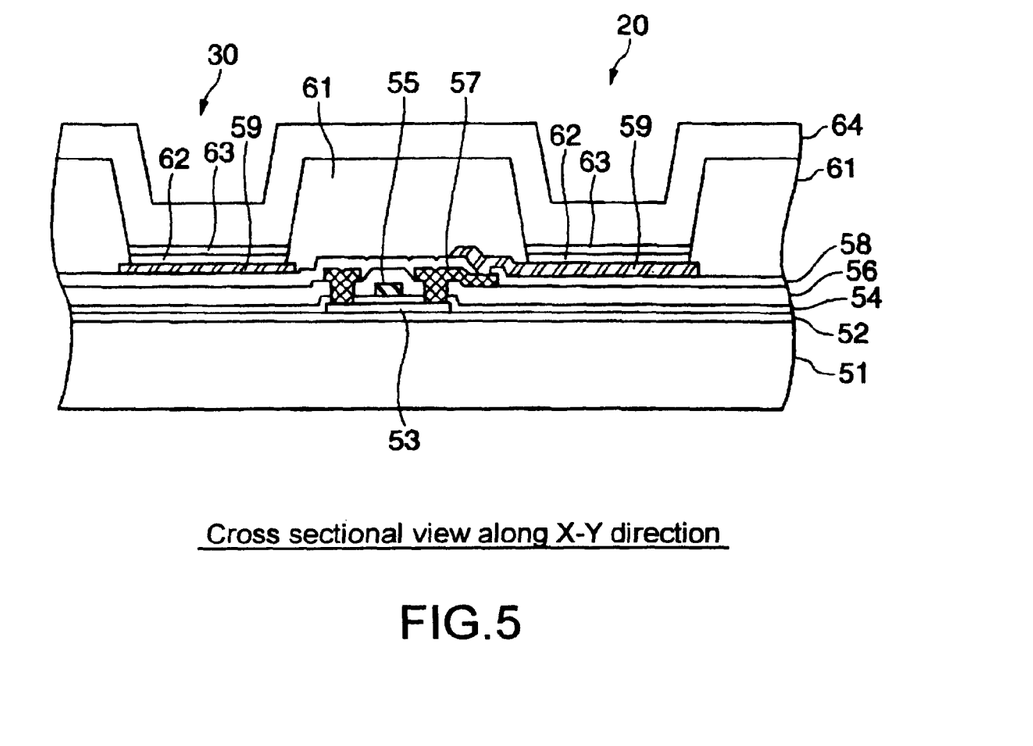
FIG. 5 is a sectional view of another constitution of the pseudo-pixel 30.

FIG. 5 shows third exemplary embodiment. The same reference numbers shown in FIG. 3 are referred to in FIG. 5 and explanation of them is omitted.

In this example, the hydrophilic control layer 60 is not arranged. In addition, the ITO layer 59 is installed in the pseudo-pixel 30. The ITO layer 59 in the part of the pseudo-pixel 30 is insulated from circumference. Even under this structure, the condition of a luminescent element of the effective pixel 20 is the same condition of a luminescent element of the pseudo-pixel 30 so that it is possible to determine the uniformity of a formed layer by examining the layer of the luminescent element of the pseudo-pixel 30.

Figure 6:
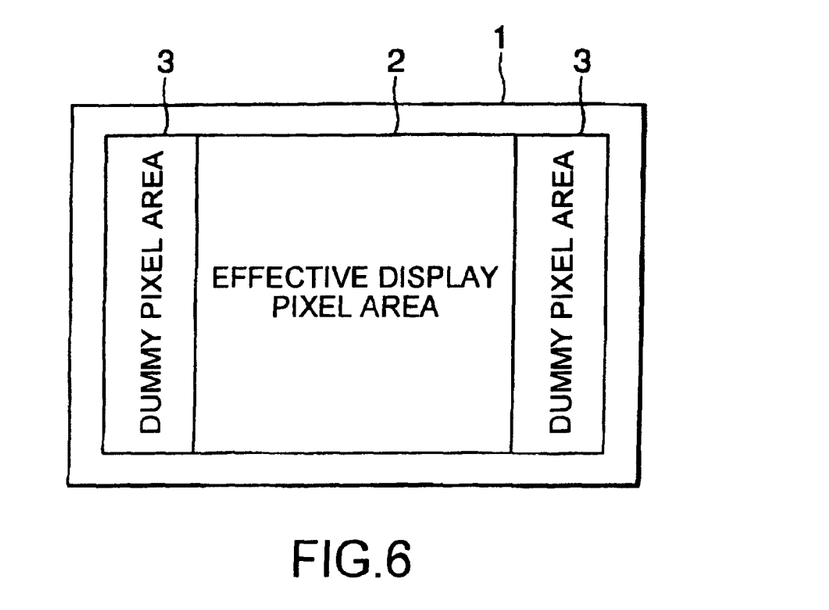
FIG. 6 is a schematic explaining another exemplary embodiment of the present invention.

FIG. 6 shows a fourth exemplary embodiment. In this example, the region 3 of the pseudo-pixels 30 is formed in the left and the right side of the effective display pixel region 2. When a material to form a layer is coated on the substrate by moving the inkjet head (not shown in FIG. 6) to the left and right direction repeatedly, such arrangement of the pseudo-pixels may be appropriate.

Figure 7:
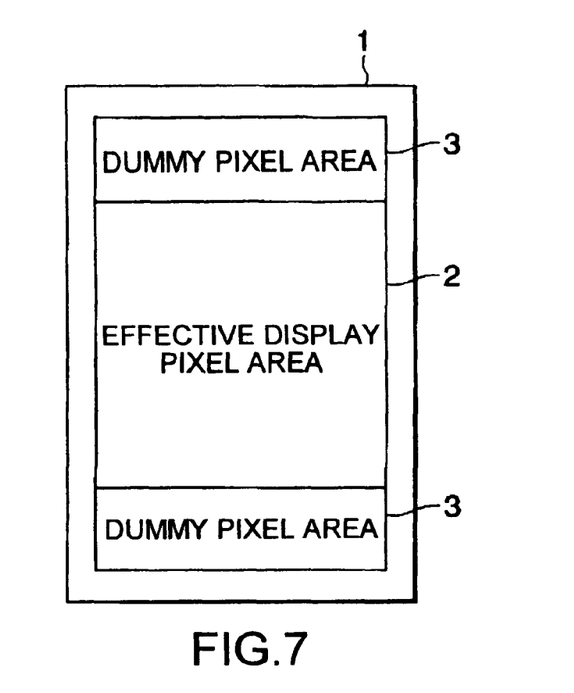
FIG. 7 is a schematic of another exemplary embodiment of the present invention.

FIG. 7 shows a fifth exemplary embodiment. In this example, the region 3 of the pseudo-pixel 30 is formed in the top and the bottom side of the effective display pixel region 2. When a material to form a layer is coated on the substrate by moving the inkjet head (not shown in FIG. 7) to the top and bottom direction repeatedly, such arrangement of the pseudo-pixels may be appropriate.

Some examples of electronic apparatus provided with a display device of the present invention are described below. But, application is not limited to these examples.

Mobile Type Computer

Figure 8:
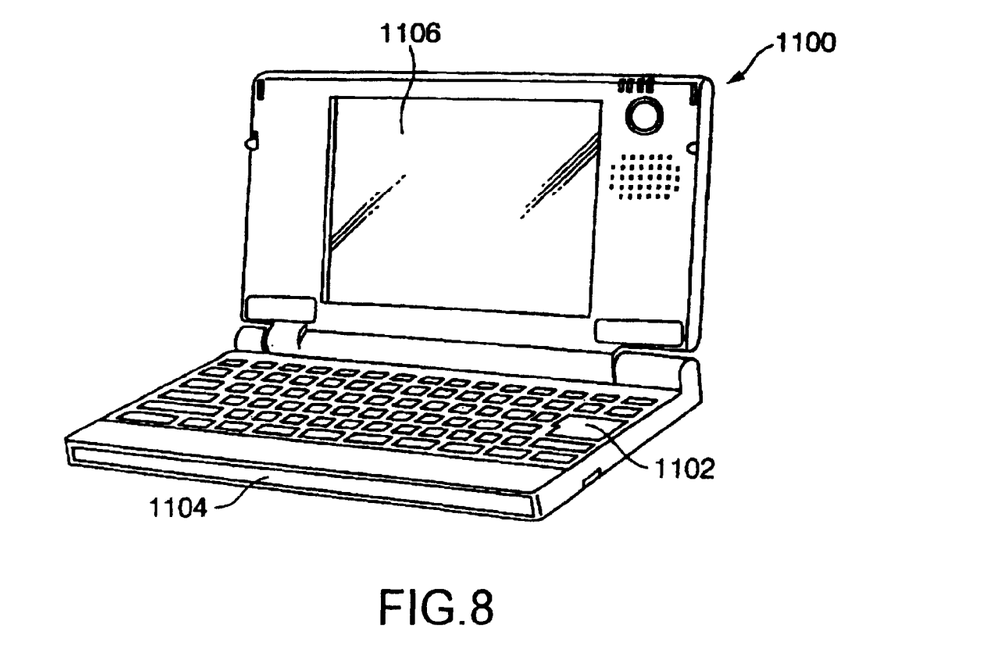
FIG. 8 is a schematic perspective view of a mobile type personal computer which is an exemplary electronic device that incorporates the invention.

First, an example where a display device of the above-mentioned exemplary embodiment is applied to a mobile type personal computer is described. FIG. 8 is a perspective view showing a personal computer. In FIG. 8, a personal computer 1100 includes a main body portion 1104 provided with a keyboard 1102, and a display device unit provided with a display device 1106 described above (it is equivalent to the display device 1 in FIG. 1).

Cellular Phone

Figure 9:
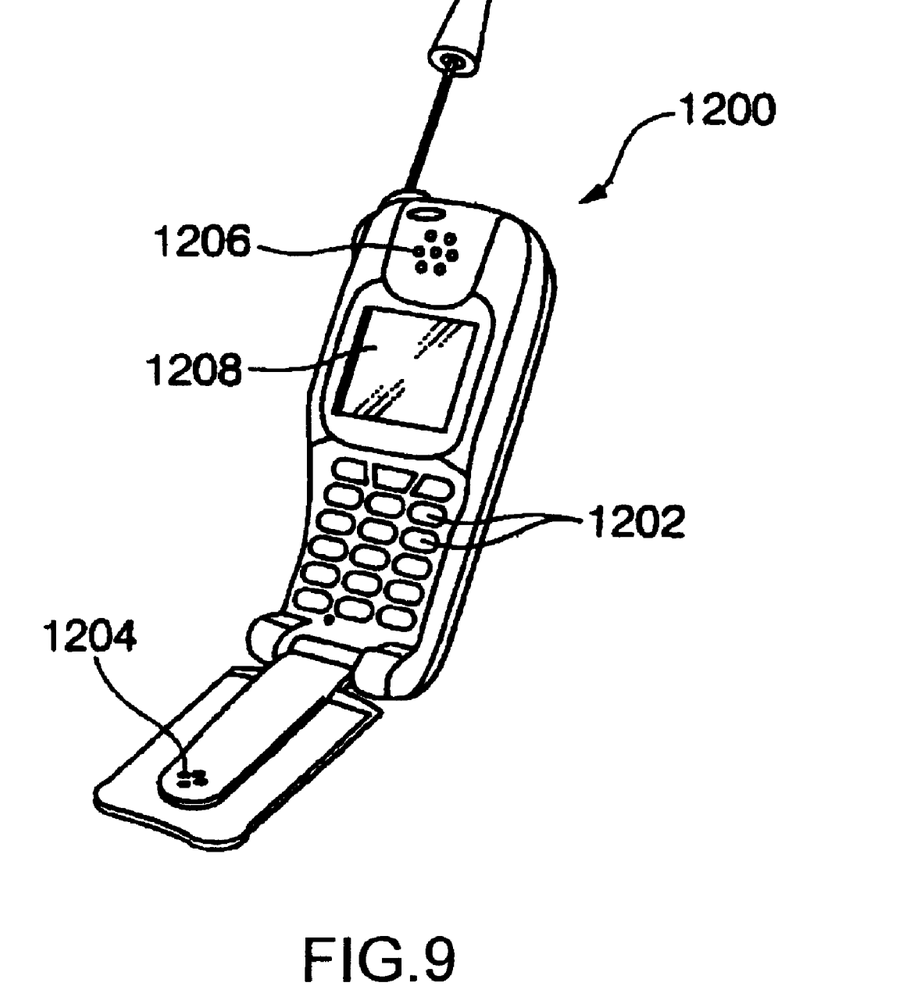
FIG. 9 is a schematic perspective view of a cellular phone provided with an electro optical device related to the present invention which is an exemplary electronic device that incorporates the invention.

Next, an example where a display device of the above mentioned exemplary embodiment is applied to a display portion for a cellular phone. FIG. 9 is a perspective view of a cellular phone. In FIG. 9, a cellular phone 1200 includes plural operation buttons 1202, an earpiece 1024, a mouthpiece 1206 and an above mentioned display device 1208.

Digital Still Camera

Figure 10:
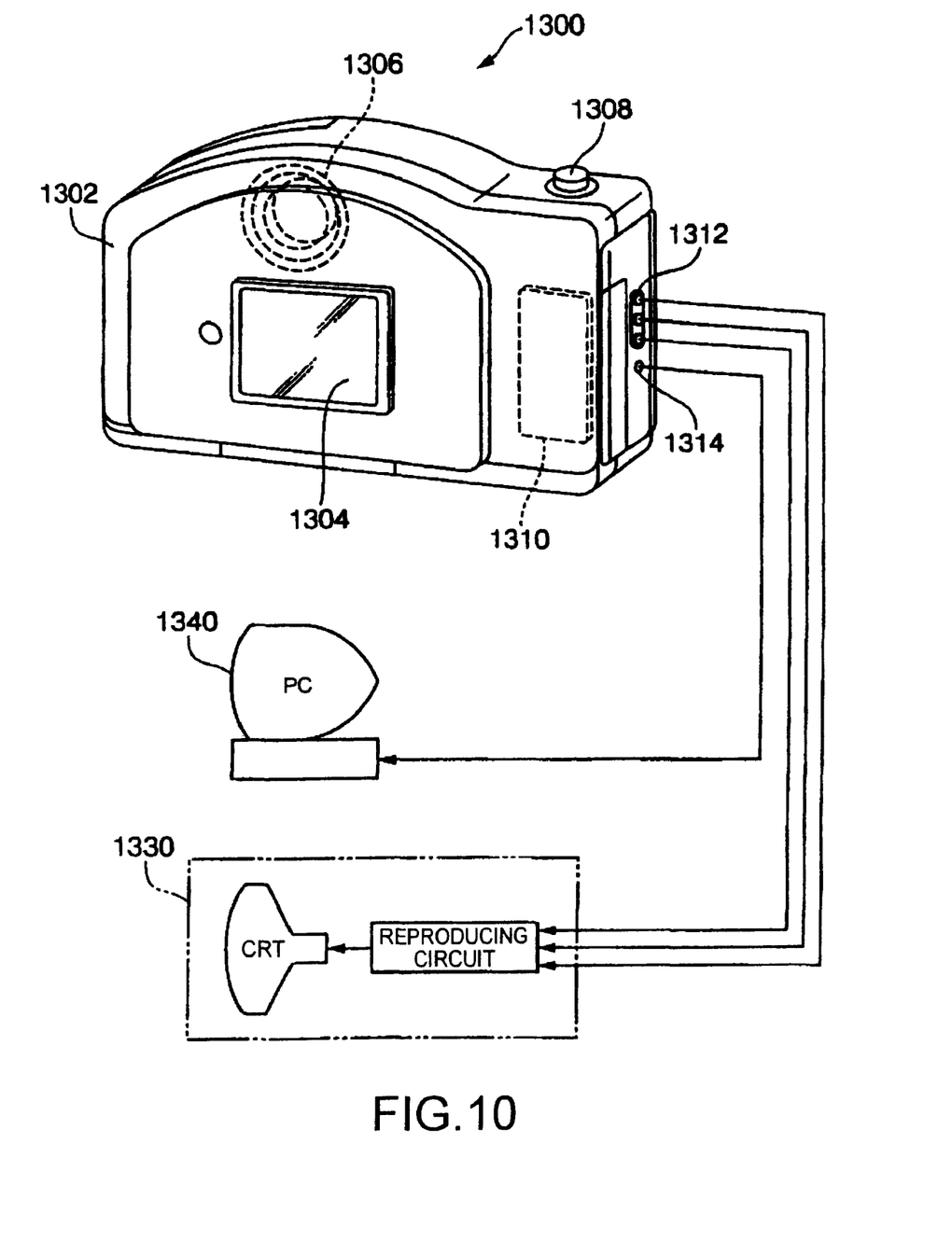
FIG. 10 is a schematic perspective view of a digital camera provided with the electro optical device related to the present invention which is an exemplary electronic device that incorporates the invention.

A digital still camera provided with a finder including the display device related to the above mentioned exemplary embodiment is described. FIG. 10 is a perspective view showing a digital still camera and a connection to outside equipment.

In a conventional camera, film is exposed to an optical image of a subject. On the other hand, in the digital still camera 1300, an optical image of a subject is converted into image pick up signals with optic electrical conversion by a image pick up elements, such as CCD (Charge Coupled Device). On the back side of a case 1302 of the digital still camera 1300, the above mentioned display device 1304 is installed so as to display an image in response to an image signal from the CCD. Hence, the display device 1304 functions as a finder displaying a subject. In addition, on the observation side of the case 1302 (the back side in FIG. 10), a light receiving unit including optics lens or the CCD is installed.

When a photographer pushes a shutter button 1308 after confirming an image of a subject displayed by the display device 1304, image pick up signals at that time are transferred to a memory in a circuit board 1310 and stored in it. In addition, this digital still camera 1300 is provided with a video signal output terminal 1312 and input and output terminals 1314 at the side of the case 1302. As shown in FIG. 10, a TV monitor 1430 is connected to the video signal output terminal 1312 and a personal computer 1430 is connected to the input and output terminal 1314, if it is necessary. Further, image pick up signals stored in a memory of the circuit board 1308 is outputted to the TV monitor 1330 and the personal computer 1340.

Electronic Book

Figure 11:
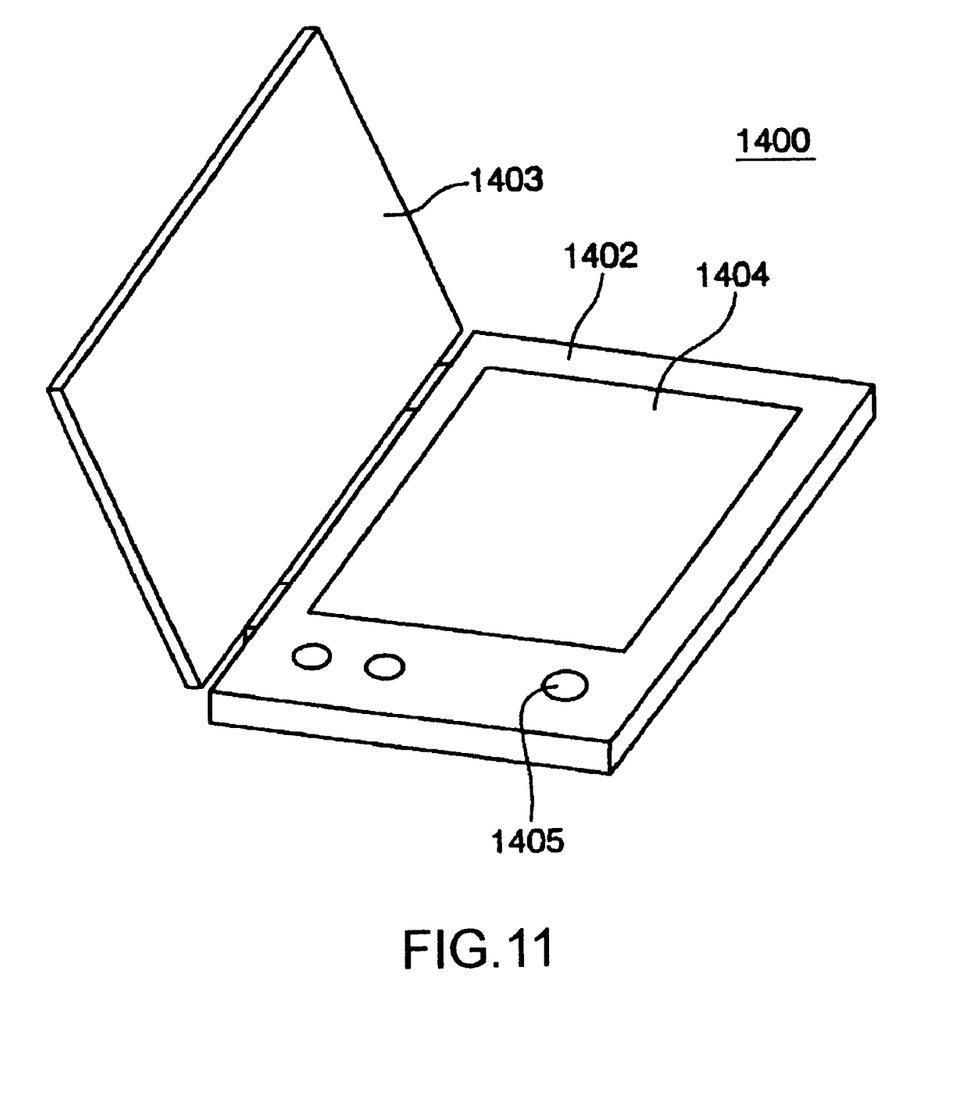
FIG. 11 is a schematic perspective view of an electronic book which is an exemplary electronic device that incorporates the invention.

FIG. 11 is a perspective view showing an electronic book as an example of electronic apparatus of the present invention. In FIG. 11, reference number 1400 corresponds to the electronic book. The electronic book 1400 includes a book style frame 1402 and a cover 1403 that can be opened or closed to this frame 1402. In the frame 1402, a display portion 1404 is installed with exposing its surface and an operation portion 1405 is also installed. In the inside of the frame 1402, a controller, a counter, and a memory are installed. According to the present exemplary embodiment, the display device 1404 is provided with pixel portions formed by filling electronic ink to a thin film element and a peripheral integrated circuit formed with being integrated with this pixel portion. A peripheral circuit is provided with a decoder-type scan driver and a data driver.

Further, as electronic apparatus, in addition to a personal computer of FIG. 8, the digital still camera of FIG. 10, and the electronic book of FIG. 11, electronic paper, a liquid crystal television, a view finder type or a monitor direct view type video recorder, a navigation system for an automobile, a pager, an electronic note, an electronic calculator, a word processor, a work station, a TV phone, a POS terminal, an apparatus with a touch panel can be used, for example. The above mentioned display device can be applied to these and other electronic apparatus.

When the above mentioned display device is installed in the above-mentioned electronic apparatus, sight recognition of an image displayed on a display portion can be deteriorated depending on a body's color. For example, when a body color is white, silver, or reflection or luster nature, and the border portion between a display and a body shows the same colors, such as white or silver, a border portion between a display and a body happens to be blurred. In such case, if a colored region, of which color is different from a body's color or shows sufficient contrast against it, is installed in the dummy pixel region, sight recognition of an image shown in a display portion can be enhanced, whereas any colors are displayed in a display portion.

In the case of a so-called back emission type where light emitted from the organic EL layer 63 is taken out from the side of the substrate 51, a coloration material may be attached at the backside of the substrate 51.

In the case of a so-called top emission type where light emitted from the organic EL layer 63 is taken out from the side of common electrode (in the above exemplary embodiment, the cathode 64 is referred to as the common electrode), a color region may be installed on the common electrode or the cathode 64 may be replaced with a color region.

In addition, an illumination region that emits color light, which is different from body's color, may be provided with supplying electric power to a pixel in a dummy pixels area via a pixel electrode.

EFFECTS OF THE INVENTION

As discussed above, the display device of the present invention is provided with pseudo-pixels arranged in the region that is adjacent to the region of effective display pixels, enabling the starting and ending of ejection of a material to form a layer in the region including pseudo-pixels by an inkjet method. Hence, forming a layer with uniformity can be easily attained in the effective display region.

What is claimed:

1. A method of manufacturing an electro-optical device, the electro-optical device including a data drive circuit and a substrate having an effective display region and a pseudo-pixel region being positioned outside of the display region, the effective display region including a plurality of display pixels, the pseudo-pixel region not contributing a display, the method comprising:

forming organic EL layers on the effective display region and the pseudo-pixel region, wherein the organic EL layers formed on the pseudo-pixel region are disposed above a data line drive circuit.

2. A method of manufacturing an electro-optical device, the electro-optical device including a data drive circuit and, a substrate having an effective display region and a pseudo-pixel region being positioned outside of the display region, the effective display region including a plurality of display pixels, the pseudo-pixel region not contributing a display, the method comprising:

forming organic EL layers on the effective display region and the pseudo-pixel region, wherein the organic EL layers formed on the pseudo-pixel region are disposed above a scanning line drive circuit.

3. The method of manufacturing the electro-optical device according to claim 2, the organic EL layers formed by an inkjet method.

* * * * *